United States Patent
Chambers et al.

(10) Patent No.: US 7,470,577 B2
(45) Date of Patent: Dec. 30, 2008

(54) DUAL WORK FUNCTION CMOS DEVICES UTILIZING CARBIDE BASED ELECTRODES

(75) Inventors: James Joseph Chambers, Dallas, TX (US); Luigi Colombo, Dallas, TX (US); Mark Robert Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 266 days.

(21) Appl. No.: 11/204,235

(22) Filed: Aug. 15, 2005

(65) Prior Publication Data

US 2007/0037335 A1    Feb. 15, 2007

(51) Int. Cl.
    *H01L 21/00*    (2006.01)
(52) U.S. Cl. .................. 438/197; 438/198; 438/199
(58) Field of Classification Search .......... 438/197, 438/199, 746, 198; 257/369
    See application file for complete search history.

(56) References Cited

U.S. PATENT DOCUMENTS

| | | | |
|---|---|---|---|
| 6,204,103 B1 | 3/2001 | Bai et al. | |
| 6,265,258 B1 | 7/2001 | Liang et al. | |
| 6,770,521 B2 | 8/2004 | Visokay et al. | |
| 6,869,889 B1 * | 3/2005 | Brask et al. | 438/746 |
| 7,105,390 B2 * | 9/2006 | Brask et al. | 438/149 |
| 7,176,531 B1 * | 2/2007 | Xiang et al. | 257/369 |
| 7,226,831 B1 * | 6/2007 | Metz et al. | 438/216 |
| 7,229,873 B2 * | 6/2007 | Colombo et al. | 438/231 |
| 7,250,351 B2 * | 7/2007 | Furukawa et al. | 438/423 |
| 2003/0006500 A1 | 1/2003 | Tatoh et al. | |
| 2005/0156256 A1 * | 7/2005 | Kim et al. | 257/410 |
| 2006/0081939 A1 * | 4/2006 | Akasaka et al. | 257/371 |
| 2006/0084247 A1 * | 4/2006 | Liu | 438/510 |
| 2006/0115940 A1 * | 6/2006 | Kim et al. | 438/197 |
| 2007/0037335 A1 * | 2/2007 | Chambers et al. | 438/197 |
| 2007/0145498 A1 * | 6/2007 | Metz et al. | 257/410 |
| 2008/0102613 A1 * | 5/2008 | Elers | 438/584 |
| 2008/0164581 A1 * | 7/2008 | Cho et al. | 257/632 |

* cited by examiner

*Primary Examiner*—Laura M Menz
(74) *Attorney, Agent, or Firm*—Wade J. Brady, III; Frederick J. Telecky, Jr.

(57) ABSTRACT

Concurrently forming different metal gate transistors having respective work functions is disclosed. In one example, a metal carbide, which has a relatively low work function, is formed over a semiconductor substrate. Oxygen and/or nitrogen are then added to the metal carbide in a second region to establish a second work function in the second region, where the metal carbide itself establishes a first work function in a first region. One or more first metal gate transistor types are then formed in the first region and one or more second metal gate transistor types are formed in the second region.

5 Claims, 16 Drawing Sheets

DUAL WORK FUNCTION CMOS DEVICES UTILIZING CARBIDE BASED ELECTRODES

FIELD OF INVENTION

The present invention relates generally to semiconductor devices and more particularly to fabricating PMOS and NMOS transistor devices having metal gates.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source while providing increased computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there has been and continues to be efforts toward scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

One way to increase packing densities is to decrease the thickness of transistor gate dielectrics to shrink the overall dimensions of transistors, where a very large number of transistors are commonly used in IC's and electronic devices. Transistor gate dielectrics (e.g., silicon dioxide or nitrided silicon dioxide) have previously had thicknesses on the order of about 10 nm or more, for example. More recently, however, this has been reduced considerably to reduce transistor sizes and facilitate improved performance. Thinning gate dielectrics can have certain drawbacks, however. For example, a polycrystalline silicon ("polysilicon") gate overlies the thin gate dielectric, and polysilicon naturally includes a depletion region where it interfaces with the gate dielectric. This depletion region can provide an insulative effect rather than conductive behavior, which is desired of the polysilicon gate since the gate is to act as an electrode for the transistor.

By way of example, if the depletion region acts like a 0.6 nm thick insulator and the gate dielectric is 10-nm thick, then the depletion region effectively increases the overall insulation between the gate and an underlying transistor channel by six percent (e.g., from 10 nm to 10.6 nm). It can be appreciated that as the thickness of gate dielectrics are reduced, the effect of the depletion region can have a greater impact on dielectric behavior. For example, if the thickness of the gate dielectric is reduced to 1 nm, the depletion region would effectively increase the gate insulator by about 60 percent (e.g., from 1 nm to 1.6 nm). This increased percentage significantly reduces the benefits otherwise provided by thinner gate dielectrics.

Metal gates can be used to mitigate adverse affects associated with the depletion region phenomenon because, unlike polysilicon, little to no depletion region manifests in metal. Interestingly enough, metal gates were commonly used prior to the more recent use of polysilicon gates. An inherent limitation of such metal gates, however, led to the use of polysilicon gates. In particular, the use of a single work function metal proved to be a limitation in high performance circuits that require dual work function electrodes for low power consumption. The work function is the energy required to move an electron from the Fermi level to the vacuum level. In modern CMOS circuits, for example, both p-channel MOS transistor devices ("PMOS") and n-channel MOS transistor devices ("NMOS") are generally required, where a PMOS transistor requires an electrode work function on the order of 5 eV and an NMOS transistor requires an electrode work function on the order of 4 eV. A single metal can not be used, however, to produce a metal gate that provides such different work functions. Polysilicon gates are suited for application in CMOS devices since some of the gates can be substitutionally doped in a first manner to achieve the desired work function for PMOS transistors and other gates can be substitutionally doped in a second manner to achieve the desired work function for NMOS transistors. However, polysilicon gates suffer from the aforementioned gate depletion.

Consequently, it would be desirable to be able to form metal gate transistors having different work functions so that transistor gate dielectrics can be reduced to shrink the overall size of transistors and thereby increase packing densities.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming transistors having metal gates, where the metal gates have different work functions so as to correspond to that of different transistor types, such as NMOS and PMOS transistors, for example. The metal gates of the transistors allow device dimensions, such as gate dielectric thicknesses, for example, to be reduced to facilitate increased packing densities. Additionally, the transistors can be efficiently formed as part of a CMOS fabrication process.

According to one or more aspects of the present invention, a method of forming metal gate transistors is disclosed. The method includes forming a layer of metal carbide material over a dielectric layer overlying a semiconductor substrate, where the metal carbide has a first work function. The metal carbide is selectively masked off so that the metal carbide is covered in a first region and exposed in a second region. Oxygen and/or nitrogen are then added to the exposed metal carbide in the second region to establish a second work function in the second region. A layer of polysilicon material is formed over the first and second regions, and one or more first metal gate transistor types are formed in the first region and one or more second metal gate transistor types are formed in the second region.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
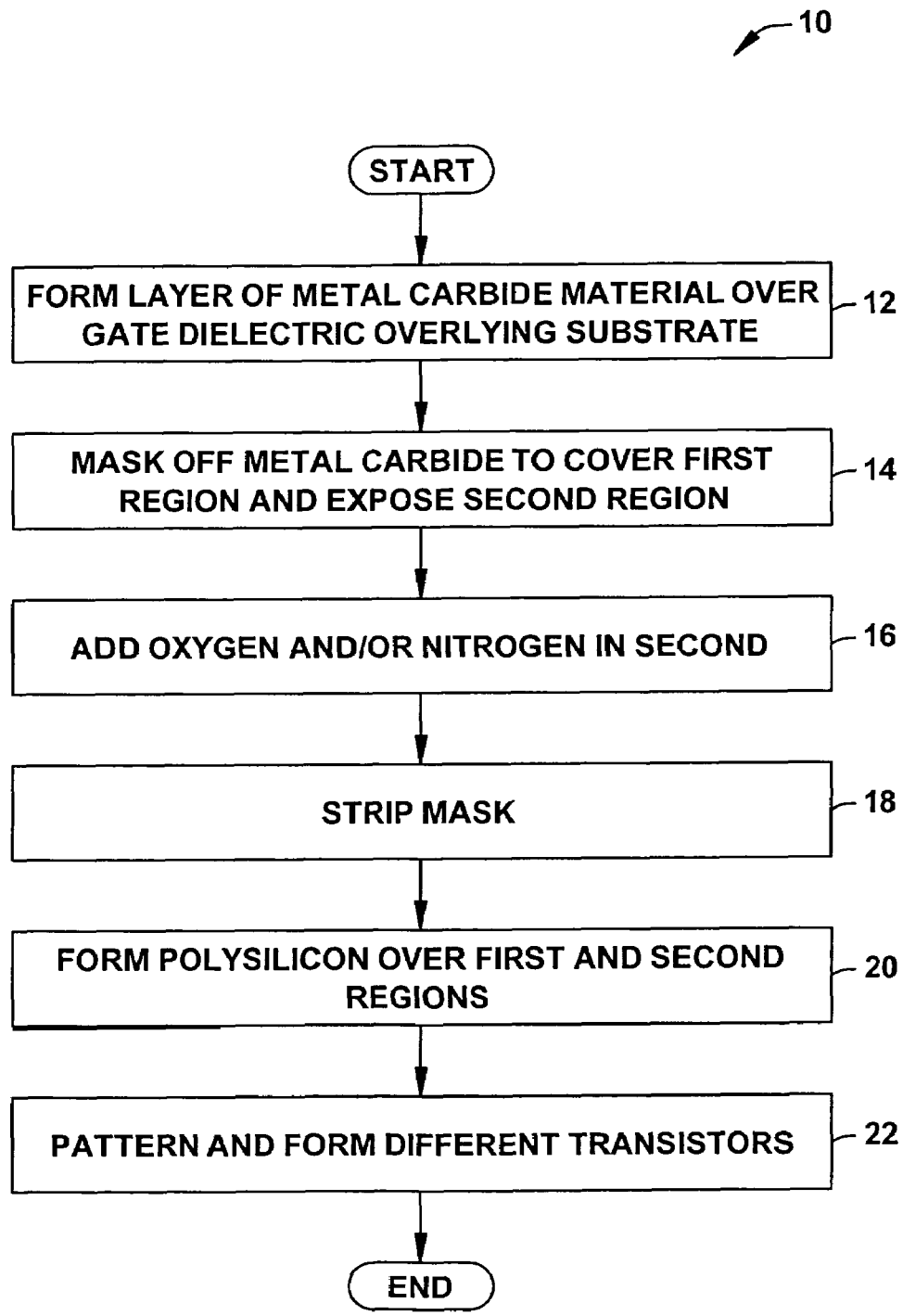
FIG. 1 is a flow diagram illustrating an exemplary methodology for forming metal gate transistors according to one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Turning to FIG. 1, an exemplary methodology 10 is illustrated for forming metal gate transistors according to one or more aspects of the present invention. As with all methodologies discussed herein, although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
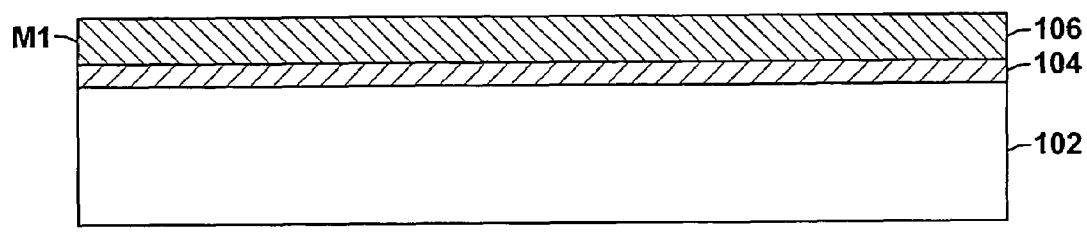
FIGS. 2-7 are fragmentary cross sectional diagrams illustrating the formation of exemplary metal gate transistors according to one or more aspects of the present invention, such as the methodology set forth in FIG. 1.

The methodology 10 begins at 12, wherein a semiconductor substrate 102 having a thin layer of dielectric material 104 has a layer of metal carbide material M1 106 formed thereover (FIG. 2). It will be appreciated that 'substrate' as referred to herein may comprise any type of semiconductor body (e.g., formed of silicon or SiGe) such as a semiconductor wafer or one or more die on a wafer, as well as any other type of semiconductor and/or epitaxial layers associated therewith. The dielectric material can have a thickness of less than about 5 nanometers, for example, and may comprise silicon oxynitride (SiON) or a high k dielectric material, such as binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

The metal carbide 106 generally has a relatively low work function of between about 3.5 eV and about 4.3 eV, for example, and may comprise Sc, Y, Ti, Zr, Hf, V, Nb, Ta, Cr, Mo, W, La lanthanides and/or actinides, for example. The metal carbide 106 can be formed in any suitable manner, such as via chemical vapor deposition (CVD), atomic layer deposition (ALD) and/or sputtering, for example, to a thickness of less than about 15 nanometers, for example.

Figure 3:
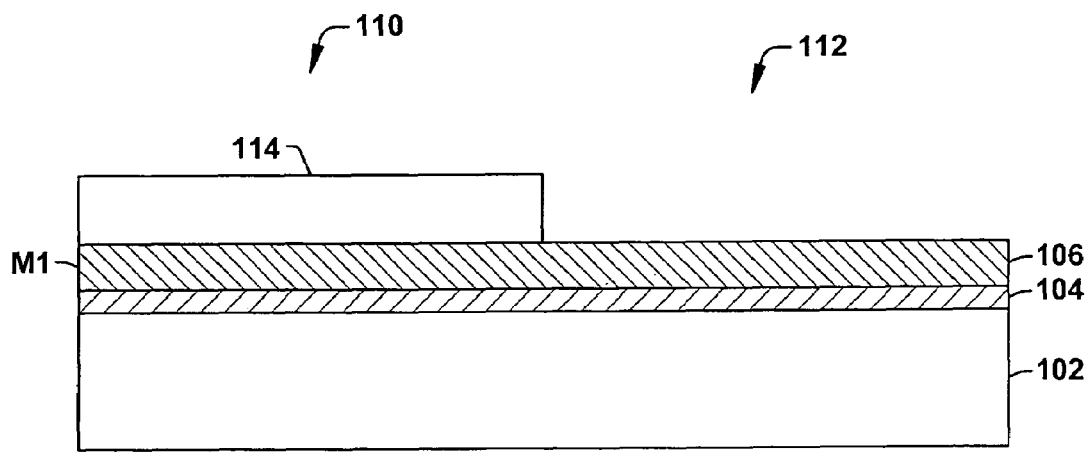

At 14, the metal carbide 106 is masked off by a selectively patterned masking material 114 so that the carbide 106 is covered in a first region 110 and exposed in a second region 112. (FIG. 3). The masking material 114 may comprise a thin layer of a capping material, such as polysilicon, for example, and (as with all patterning described herein) may be patterned with lithographic techniques, for example, where lithography broadly refers to processes for transferring one or more patterns between various media. In lithography, a light sensitive resist coating (not shown) is formed over one or more layers to which a pattern is to be transferred. The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layer or layers (e.g., thin layer of polysilicon) which can be selectively treated (e.g., etched) to transfer the pattern thereto. The patterned resist is then removed after it is used.

Figure 4:
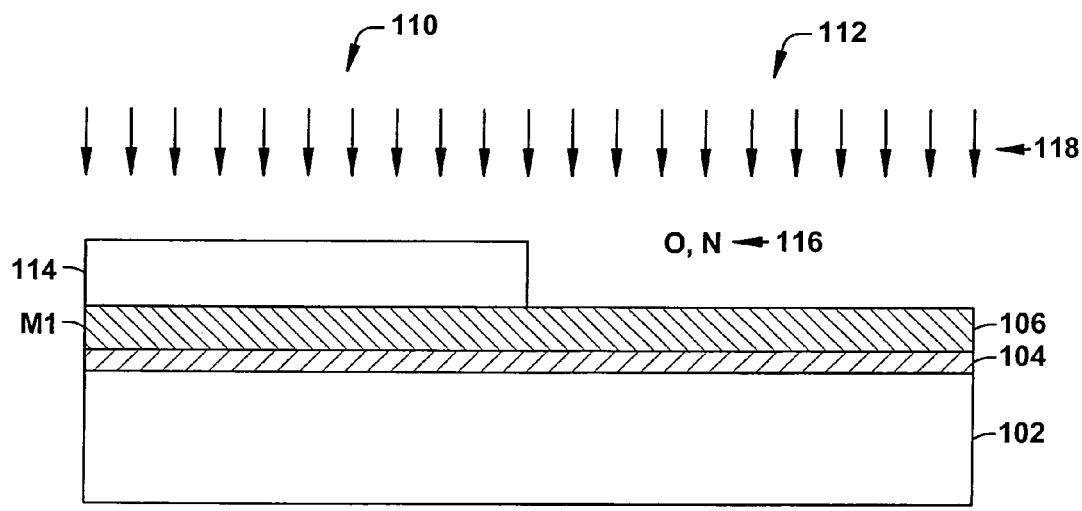
Figure 5:
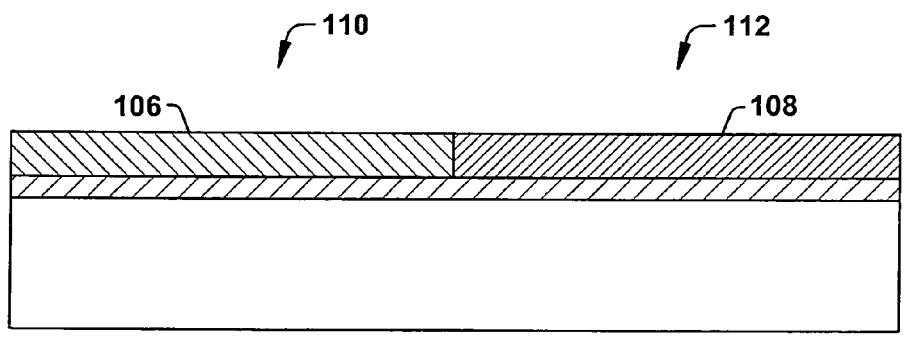

After the metal carbide 106 is masked off, oxygen and/or nitrogen 116 is added at 16 to the metal carbide 106 in the second region 112 to alter the work function in the second region and establish a second work function in the second region 112 (FIG. 4). The oxygen and/or nitrogen 116 can be added by any suitable process 118, such as thermal, plasma, wet chemical and/or implantation processing, for example, to establish a metal oxy carbide, metal nitride carbide or metal oxy nitride carbide 108 in the second region 112 (FIG. 5). By way of example, nitrogen can be introduced using a plasma process with 1000 W power at 50 mTorr pressure to establish metal carbonitride in the second region 112.

It will be appreciated that the second work function of the second region 112 is generally made higher than a first work function (of the metal carbide 106) in the first region 110. For example, the second work function can be between about 4.8 eV and about 5.5 eV, for example. It will also be appreciated that the amount, concentration, energy level, etc. of oxygen and/or nitrogen 116 added can be varied to vary the resulting composition in the second region 112. This effectively provides a means for controllably adjusting the work function in the second region 112.

Figure 6:
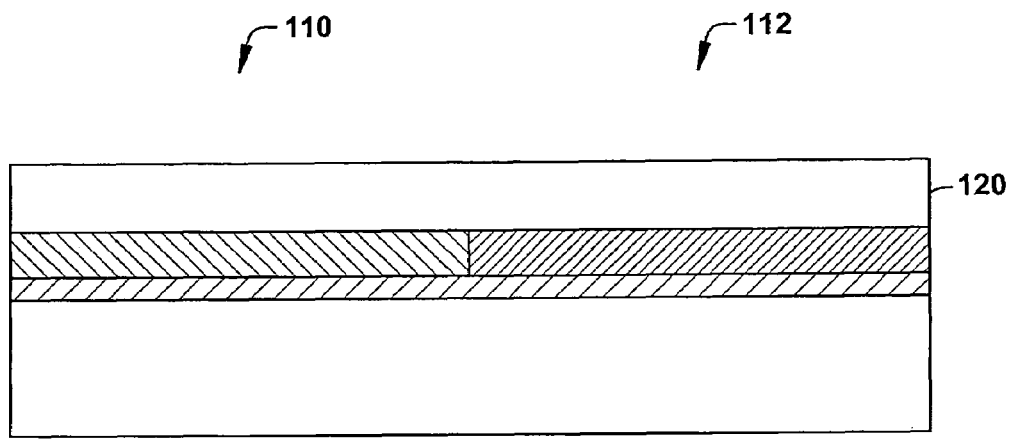

The patterned masking material is stripped at 18 (FIG. 5), and a layer of polysilicon 120 or other suitable cladding material is formed (e.g., deposited) over the first 110 and second 12 regions at 20 (FIG. 6). The polysilicon 120 can be formed to a thickness of about a few thousand nanometers or less, for example, and is generally used to form respective gate electrodes for different transistors.

Figure 7:
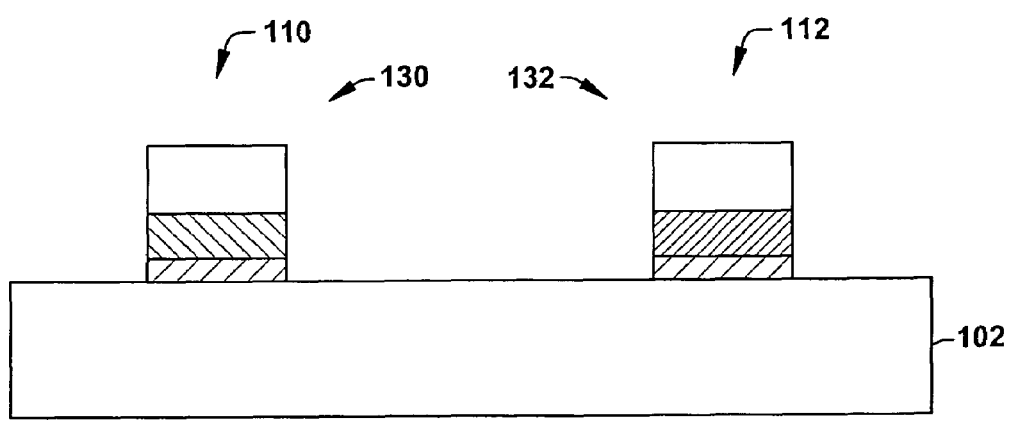

At 22, different transistor types are formed in the different regions 110, 112 (FIG. 7). For example, one or more NMOS type transistors can be fashioned in the first region 110 where the first work function is lower, while one or more PMOS type transistors can be fashioned in the second region 112 where the second work function is higher. Although not illustrated a layer of cladding or barrier material (e.g., TiN, TaN) can optionally be formed over the first 110 and second 112 regions before the polysilicon 120 is formed. Such a barrier layer material mitigates unwanted interaction between the polysilicon 120 and the metal carbide 106 in the first region 110 and the metal oxy carbide, metal nitride carbide or metal oxy nitride carbide 108 in the second region 112. The polysilicon 120, barrier, metal carbide 106, metal oxy carbide, metal nitride carbide or metal oxy nitride carbide 108 and dielectric 104 materials can be patterned to form first and second gate structures 130, 132 in the first 110 and second 112 regions, respectively, where the gate structures have a height of between about 50 to about 150 nanometers, for example.

Although not illustrated, it will be appreciated that remaining aspects of the transistors can then be formed by doping the substrate 102 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. It will be appreciated that forming metal gate transistors as described herein can be readily implemented in a CMOS fabrication process in an efficient and cost effective manner.

Figure 8:
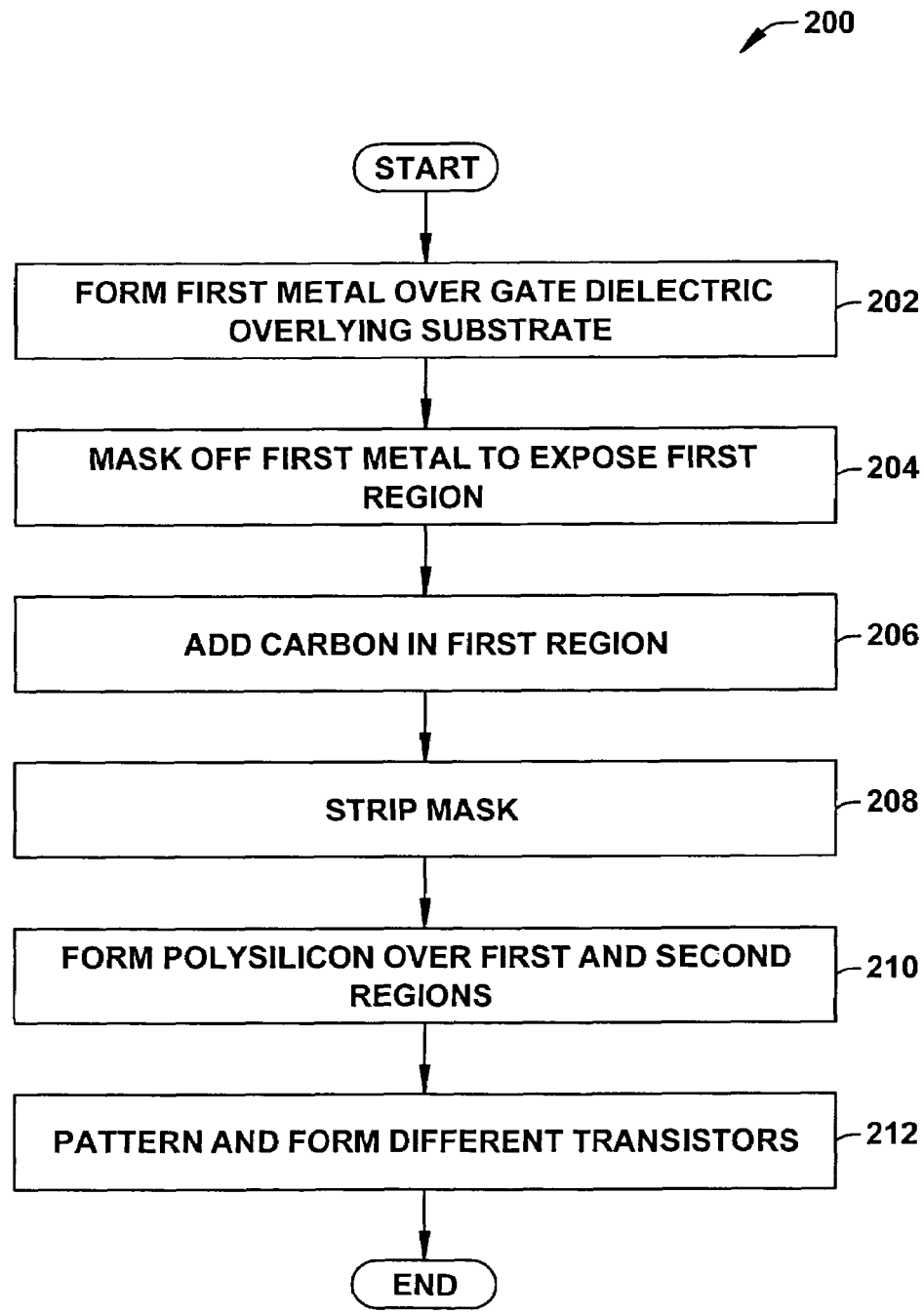
FIG. 8 is a flow diagram illustrating another exemplary methodology for forming metal gate transistors according to one or more aspects of the present invention.
Figure 9:
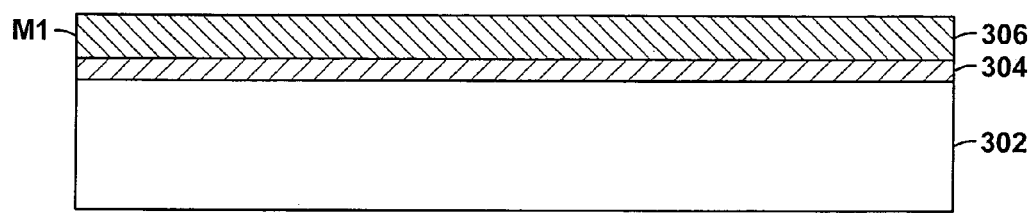
FIGS. 9-14 are fragmentary cross sectional diagrams illustrating the formation of exemplary metal gate transistors according to one or more aspects of the present invention, such as the methodology set forth in FIG. 8.

FIG. 8 illustrates another exemplary methodology 200 for forming metal gate transistors according to one or more aspects of the present invention. The methodology 200 begins at 202, wherein a semiconductor substrate 302 having a thin layer of dielectric material 304 has a first metal M1 306 formed thereover (FIG. 9). The dielectric material can have a thickness of less than about 5 nanometers, for example, and may comprise silicon oxynitride (SiON) or a high k dielectric material, such as binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

The first metal 306 generally has a relatively high work function of between about 4.8 eV and about 5.5 eV, for example, and may comprise W, Mo and/or Re, for example. The first metal 306 can be formed in any suitable manner, such as via chemical vapor deposition (CVD), atomic layer deposition (ALD) and/or sputtering, for example, to a thickness of less than about 15 nanometers, for example.

Figure 10:
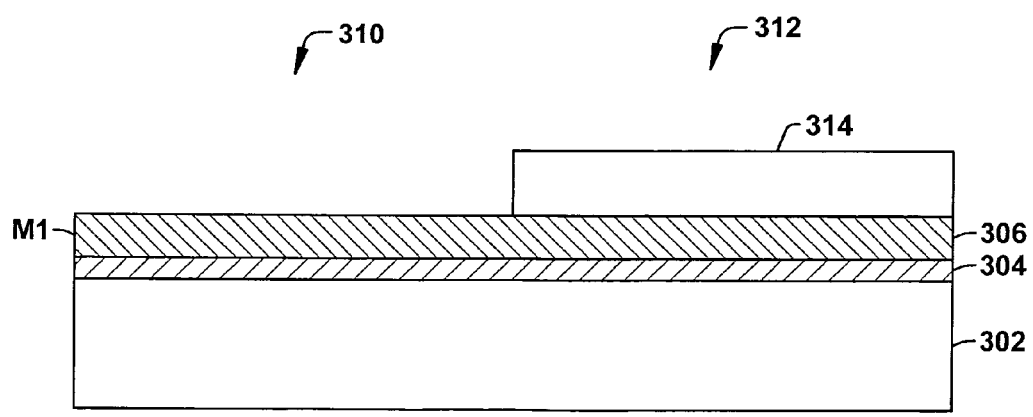

At 204, the first metal 306 is masked off by a selectively patterned masking material 314 so that the metal 306 is exposed in a first region 310 and covered in a second region 312. (FIG. 10). The masking material 314 may comprise a thin layer of a capping material, such as silicon, for example. It will be appreciated that the thin layer of capping material may also comprise polysilicon, for example. Nevertheless, mere silicon may be more desirable in certain instances, however. For example, when starting with an elemental metal, deposition of a silicon layer to yield polysilicon may lead to an undesired reaction between the silicon and the metal due to, among other things, a relatively high deposition temperature (e.g., high enough to crystallize the silicon). The use of mere silicon, however, allows other deposition processes, such as sputtering at room temperature, for example, to be performed with little to no reaction with the metal.

Figure 11:
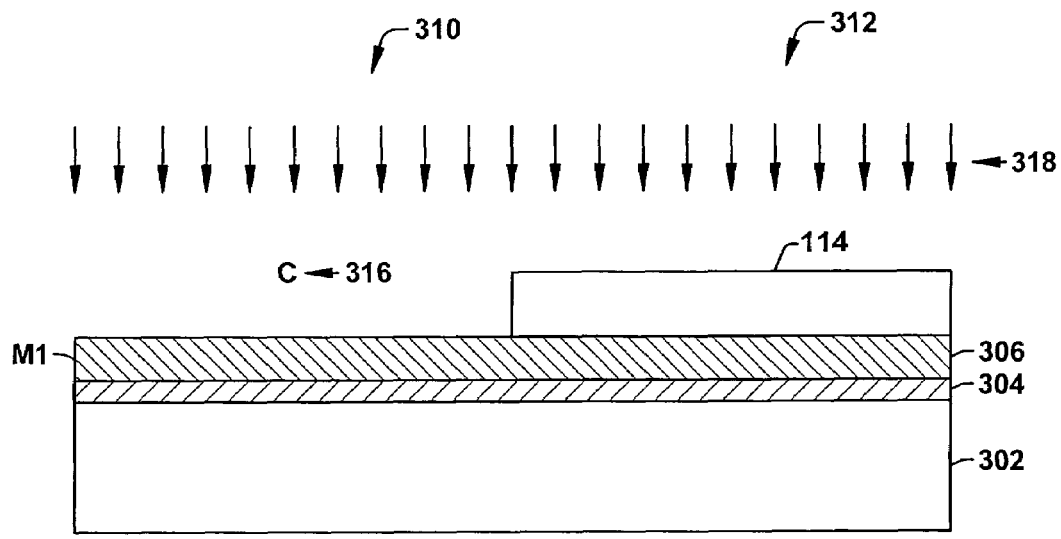
Figure 12:
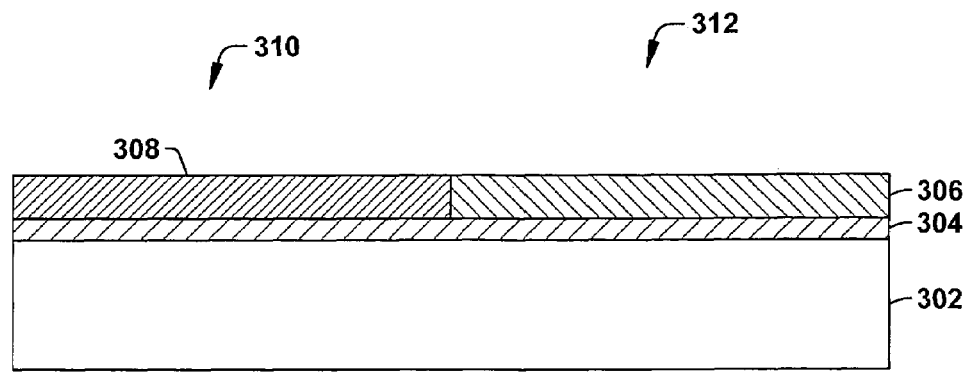

Carbon 316 is then added to the first metal 306 in the first region 310 to alter a first work function in the first region 310, where the second region 312 has a corresponding second work function (FIG. 11). The carbon 316 can be added by any suitable process 318, such as thermal, plasma, and/or implantation processing, for example, to establish a metal carbide 308 in the first region 310 (FIG. 12). By way of example, carbon can be incorporated using a methane plasma process with process pressure on the order of 50 mTorr and plasma power on the order of 1000 W to form a metal carbide 308 in the first region 310.

It will be appreciated that the first work function in the first region is generally made lower than the second work function (of the first metal 306) in the second region 312. For example, the first work function can be lowered to be between about 3.5 eV and about 4.3 eV, for example. It will also be appreciated that the amount, concentration, energy level, etc. of carbon 316 added can be varied to vary the resulting composition in the first region 310. This effectively provides a means for controllably adjusting the work function in the first region 310.

Figure 13:
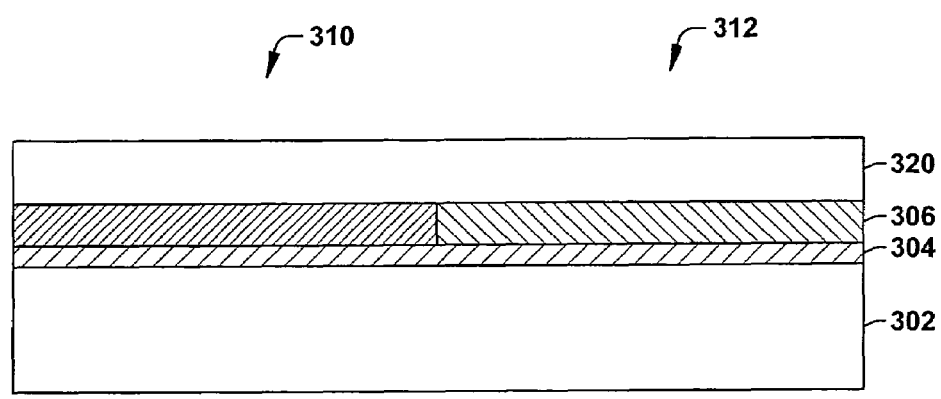

The patterned masking material 314 is stripped at 208 (FIG. 12), and a layer of polysilicon 320 is formed (e.g., deposited) over the first 310 and second 312 regions at 210 (FIG. 13). The polysilicon 320 can be formed to a thickness of about a few hundred nanometers or less, for example, and is generally used to form respective gate electrodes for different transistors.

Figure 14:
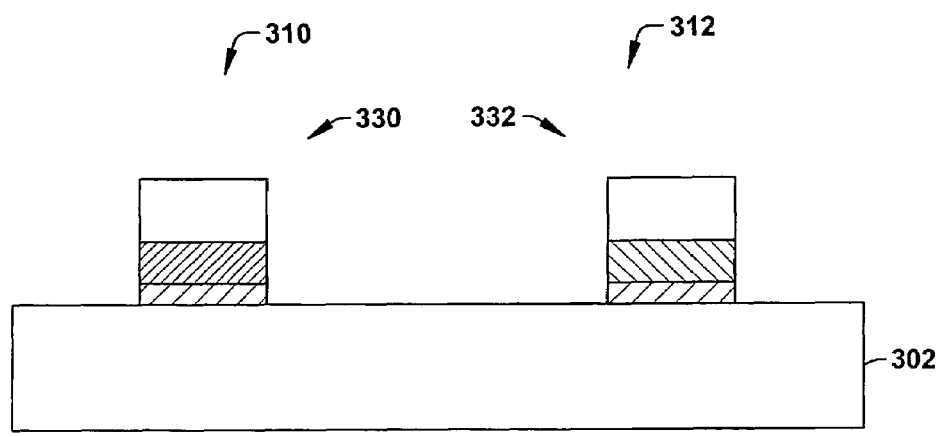

At 212, different transistor types are formed in the different regions 310, 312 (FIG. 14). For example, one or more NMOS type transistors can be fashioned in the first region 310 where the first work function is lower, while one or more PMOS type transistors can be fashioned in the second region 312 where the second work function is higher. Although not illustrated a layer of cladding or barrier material (e.g., TiN, TaN) can optionally be formed over the first 310 and second 312 regions before the polysilicon 320 is formed. Such a barrier layer material mitigates unwanted interaction between the polysilicon 320 and the metal carbide 308 in the first region 310 and the first metal 306 in the second region 312. The polysilicon 320, barrier, first metal 306, metal carbide 308 and dielectric 304 materials can be patterned to form first and second gate structures 330, 332 in the first 310 and second 312 regions, respectively, where the gate structures have a height of between about 50 to about 150 nanometers, for example.

Although not illustrated, it will be appreciated that remaining aspects of the transistors can then be formed by doping the substrate 302 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. It will be appreciated that forming metal gate transistors as described herein can be readily implemented in a CMOS fabrication process in an efficient and cost effective manner.

Figure 15:
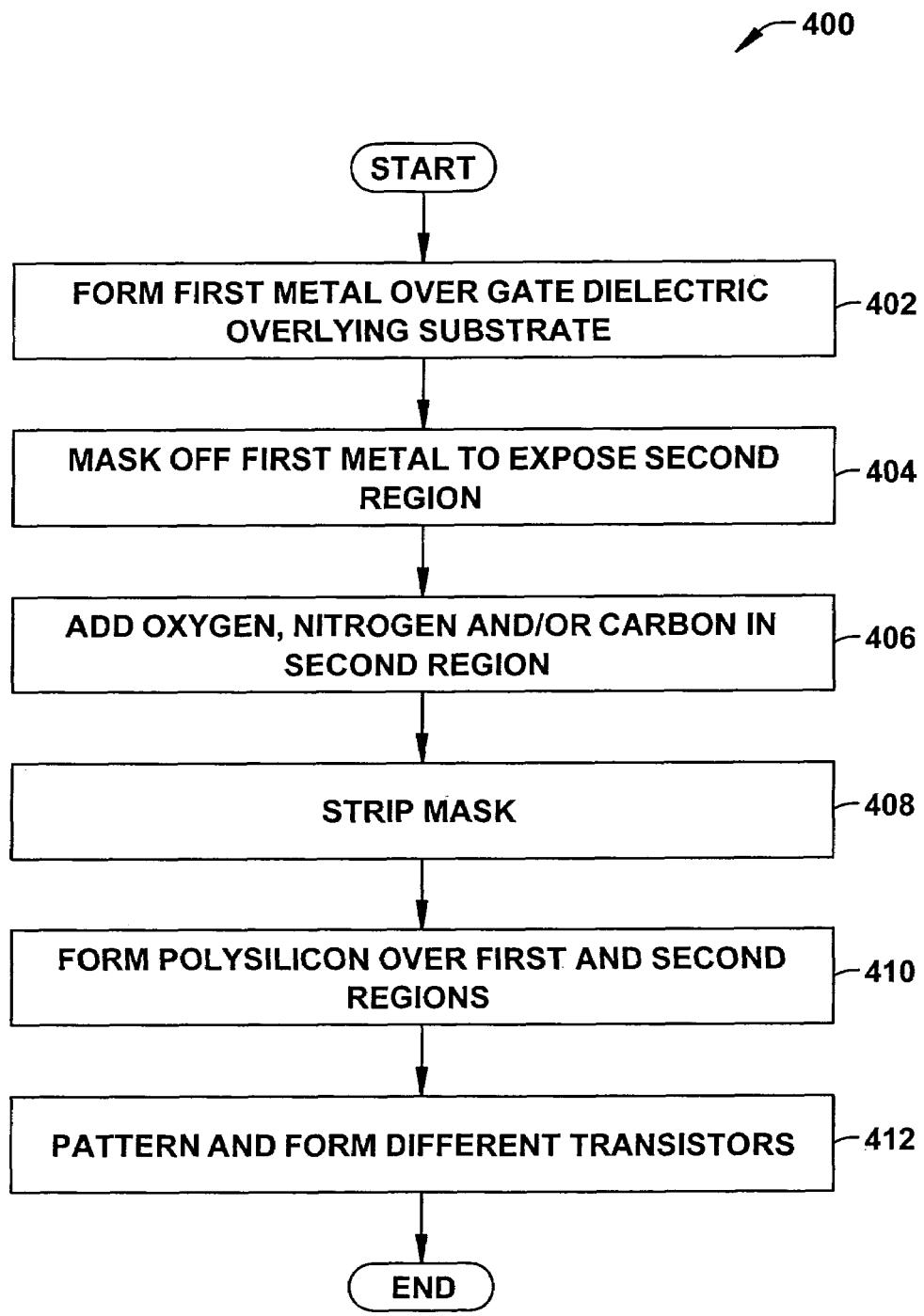
FIG. 15 is a flow diagram illustrating yet another exemplary methodology for forming metal gate transistors according to one or more aspects of the present invention.
Figure 16:
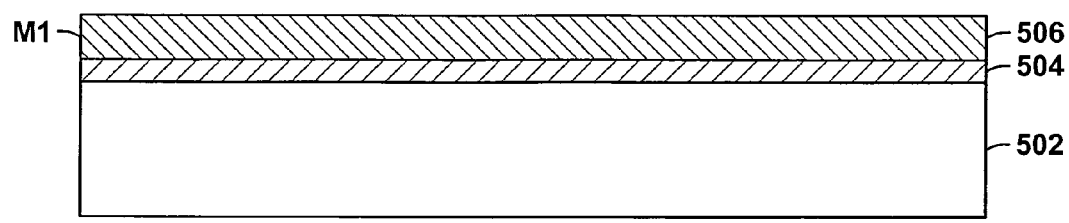
FIGS. 16-21 are fragmentary cross sectional diagrams illustrating the formation of exemplary metal gate transistors according to one or more aspects of the present invention, such as the methodology set forth in FIG. 15.

FIG. 15 illustrates yet another exemplary methodology 400 for forming metal gate transistors according to one or more aspects of the present invention. The methodology 400 begins at 402, wherein a semiconductor substrate 502 having a thin layer of dielectric material 504 has a first metal M1 506 formed thereover (FIG. 16). The dielectric material can have a thickness of less than about 5 nanometers, for example, and may comprise silicon oxynitride (SiON) or a high k dielectric material, such as binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

The first metal 506 generally has a relatively low work function of between about 3.5 eV and about 4.3 eV, for example, and may comprise Sc, Y, Ti, Zr, Hf, V, Nb, Ta, Cr, Mo, W, La, for example. The first metal 506 can be formed in any suitable manner, such as via chemical vapor deposition (CVD), atomic layer deposition (ALD) and/or sputtering, for example, to a thickness of less than about 15 nanometers, for example.

Figure 17:
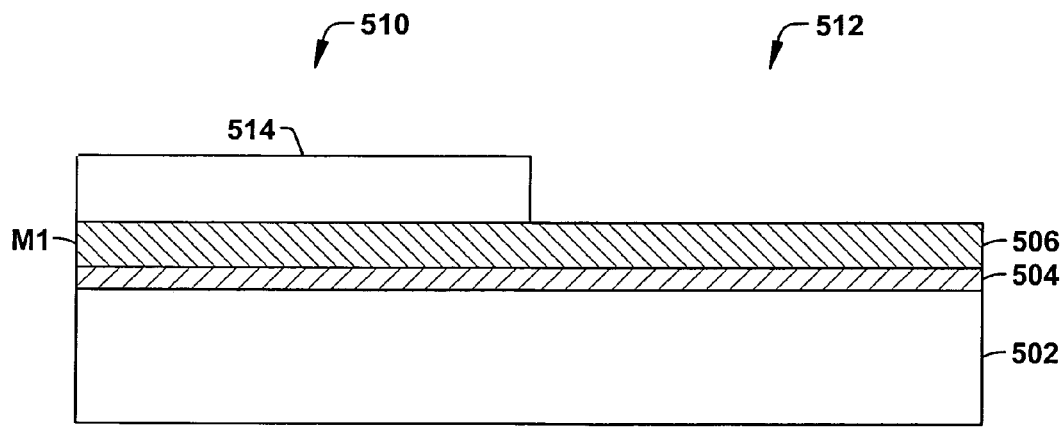

At 404, the first metal 506 is masked off by a selectively patterned masking material 514 so that the metal 506 is covered in a first region 510 and exposed in a second region 512. (FIG. 17). The masking material 514 may comprise a thin layer of a capping material, such as silicon, for example.

Figure 18:
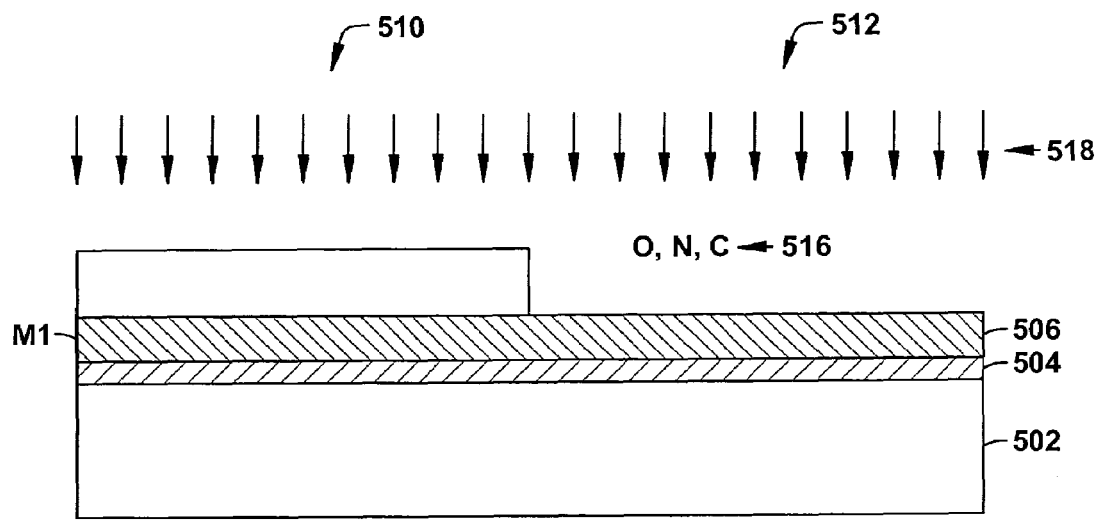
Figure 19:
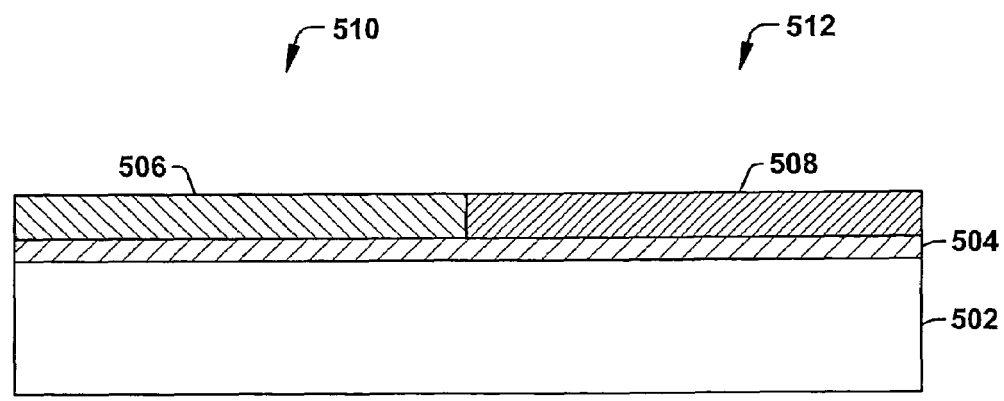

Oxygen, nitrogen and/or carbon 516 are added to the first metal 506 in the second region 512 to alter a second work function in the second region 512, where the first region 510 has a corresponding first work function from the first metal 506 (FIG. 18). The oxygen, nitrogen and/or carbon 516 can be added by any suitable process 518, such as thermal, plasma, and/or implantation processing, for example, to establish a metal oxy carbide, metal nitride carbide or metal oxy nitride carbide 508 in the second region 512 (FIG. 19). By way of example carbon can be incorporated using a methane plasma process with process pressure on the order of 50 mTorr and plasma power on the order of 1000 W to form a carbide in the second region 512. Further, nitrogen and/or oxygen can be added using nitrogen and/or oxygen plasma process(es) with process pressure on the order of 50 mTorr and plasma power on the order of 1000 W to yield a metal carbonitrde, carbo-oxide or carbo-oxynitride.

It will be appreciated that the second work function of the second region 512 is generally made higher than the first work function of the first region 510. For example, the second work function can be between about 4.8 eV and about 5.5 eV, for example. It will also be appreciated that the amount, concentration, energy level, etc. of oxygen, nitrogen and/or carbon 516 added can be varied to vary the resulting composition in the second region 512. This effectively provides a means for controllably adjusting the work function in the second region 512.

Figure 20:
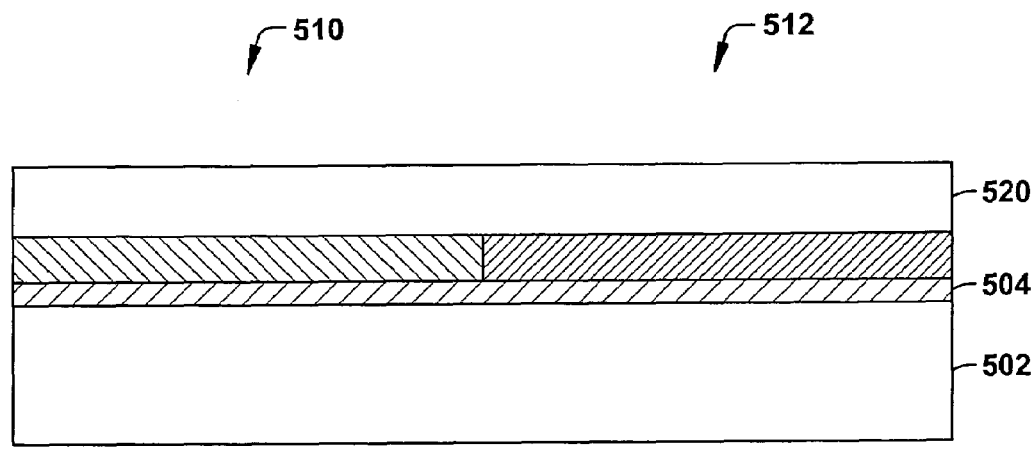

The patterned masking material 514 is stripped at 408 (FIG. 19), and a layer of polysilicon 520 is formed (e.g., deposited) over the first 510 and second 512 regions at 410 (FIG. 20). The polysilicon 520 can be formed to a thickness of about a few thousand nanometers or less, for example, and is generally used to form respective gate electrodes for different transistors.

Figure 21:
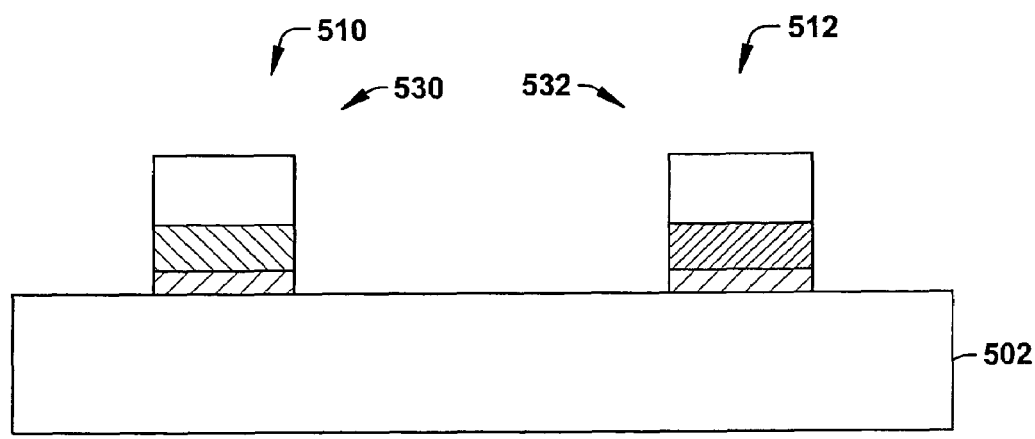

At 412, different transistor types are formed in the different regions 510, 512 (FIG. 21). For example, one or more NMOS type transistors can be fashioned in the first region 510 where the first work function is lower, while one or more PMOS type transistors can be fashioned in the second region 512 where the second work function is higher. Although not illustrated a layer of cladding or barrier material (e.g., TiN, TaN) can optionally be formed over the first 510 and second 512 regions before the polysilicon 520 is formed. Such a barrier layer material mitigates unwanted interaction between the polysilicon 520 and the first metal 506 in the first region 510 and the metal oxy carbide, metal nitride carbide or metal oxy nitride carbide 508 in the second region 512. The polysilicon 520, barrier, first metal 506, metal oxy carbide, metal nitride carbide or metal oxy nitride carbide 508 and dielectric 504 materials can be patterned to form first and second gate structures 530, 532 in the first 510 and second 512 regions, respectively, where the gate structures have a height of between about 50 to about 150 nanometers, for example.

Although not illustrated, it will be appreciated that remaining aspects of the transistors can then be formed by doping the substrate 502 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. It will be appreciated that forming metal gate transistors as described herein can be readily implemented in a CMOS fabrication process in an efficient and cost effective manner.

Figure 22:
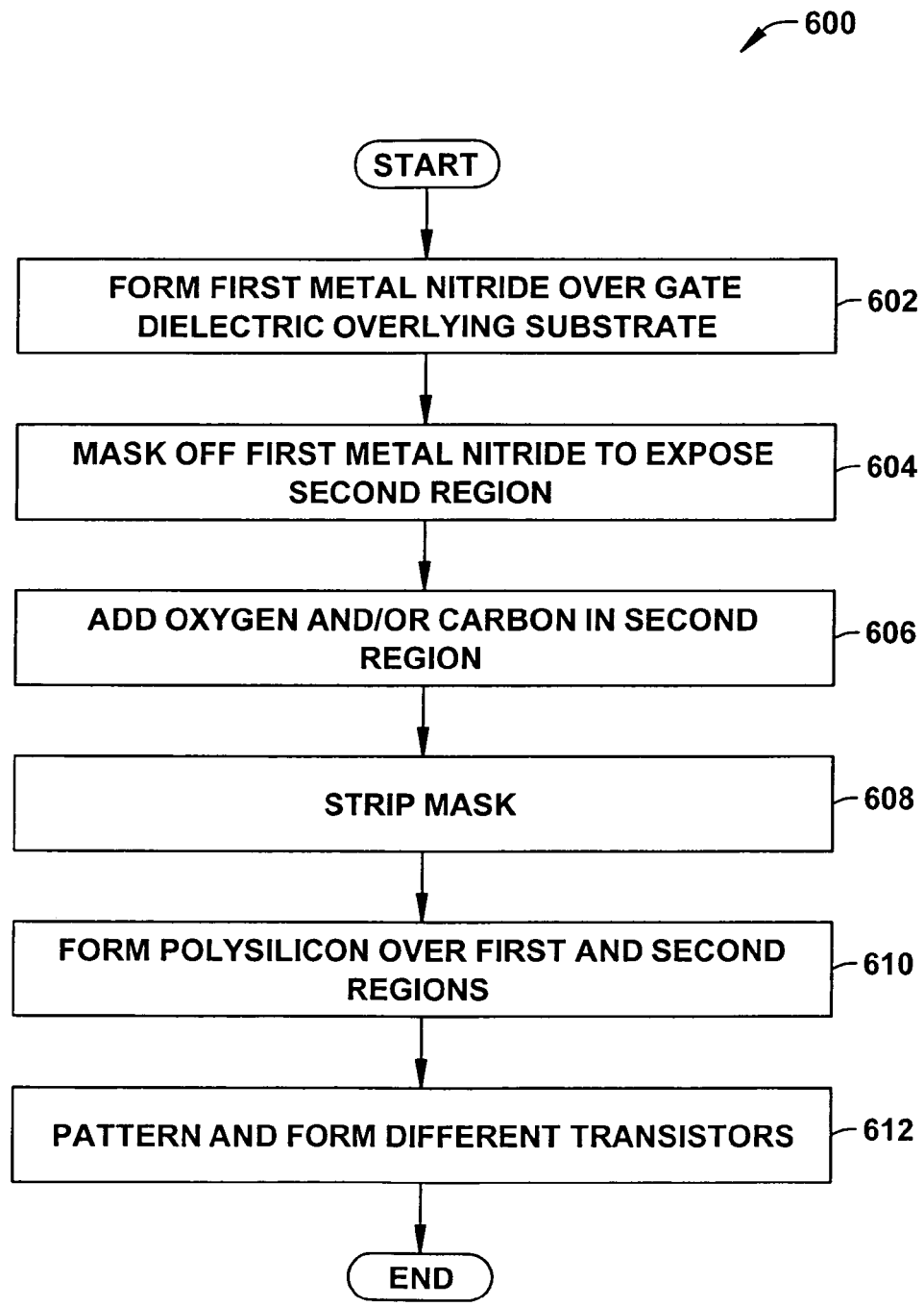
FIG. 22 is a flow diagram illustrating another exemplary methodology for forming metal gate transistors according to one or more aspects of the present invention.
Figure 23:
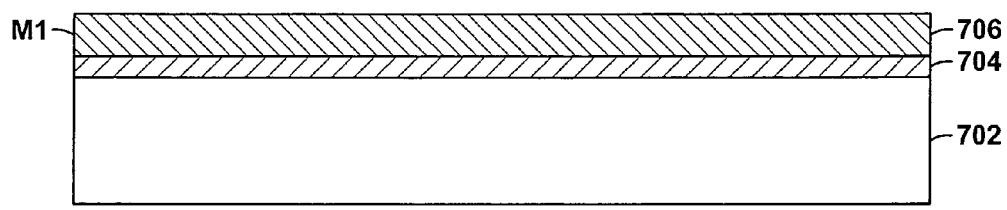
FIGS. 23-28 are fragmentary cross sectional diagrams illustrating the formation of exemplary metal gate transistors according to one or more aspects of the present invention, such as the methodology set forth in FIG. 22.

FIG. 22 illustrates still another exemplary methodology 600 for forming metal gate transistors according to one or more aspects of the present invention. The methodology 600 begins at 602, wherein a semiconductor substrate 702 having a thin layer of dielectric material 704 has a first metal M1 706 formed thereover (FIG. 23). The dielectric material 704 can have a thickness of less than about 5 nanometers, for example, and may comprise silicon oxynitride (SiON) or a high k dielectric material, such as binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

The first metal 706 is a metal nitride that has a relatively low work function of between about 3.5 eV and about 4.3 eV, for example, and may comprise TaN, for example. The first metal 706 can be formed in any suitable manner, such as via chemical vapor deposition (CVD), atomic layer deposition (ALD) and/or sputtering, for example, to a thickness of less than about 15 nanometers, for example.

Figure 24:
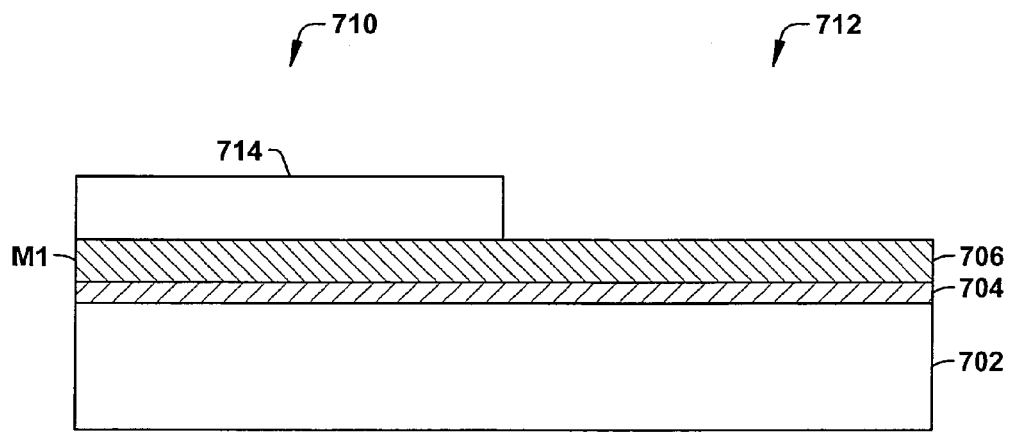

At 604, the first metal 706 is masked off by a selectively patterned masking material 714 so that the metal 706 is covered in a first region 710 and exposed in a second region 712 (FIG. 24). The masking material 714 may comprise a thin layer of a capping material, such as polysilicon, for example.

Figure 25:
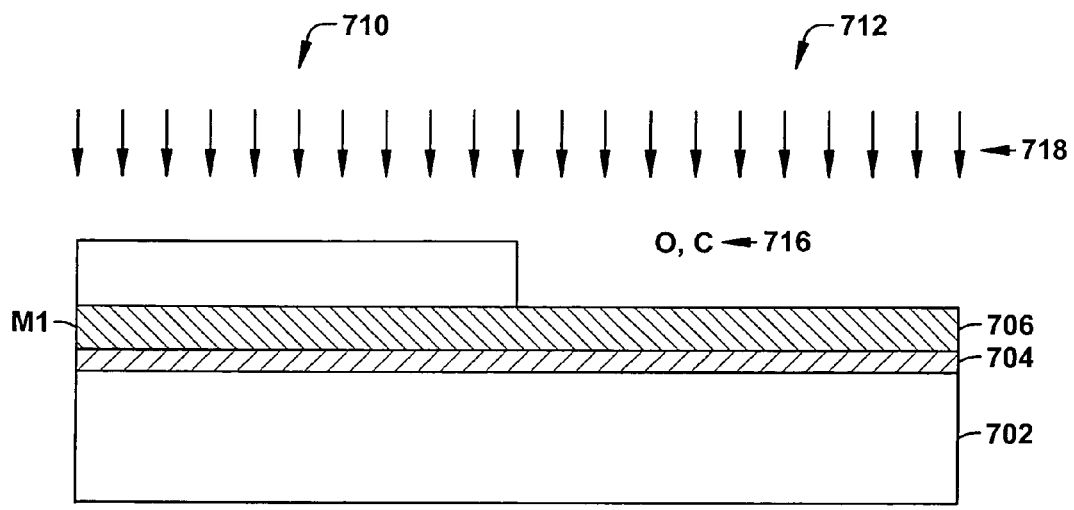
Figure 26:
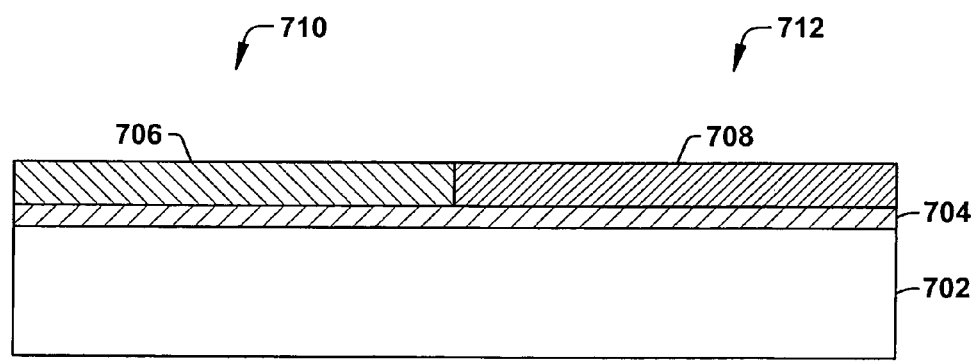

Oxygen and/or carbon 716 are added to the first metal 706 in the second region 712 to alter a second work function in the second region 712, where the first region 710 has a corresponding first work function from the first metal 706 (FIG. 25). The oxygen and/or carbon 716 can be added by any suitable process 718, such as thermal, plasma, and/or implantation processing, for example, to establish a metal oxy nitride, metal carbide nitride or metal oxy carbide nitride 708 in the second region 712 (FIG. 26). By way of example, carbon can be incorporated using a methane plasma process with process pressure on the order of 50 mTorr and plasma power on the order of 1000 W to form a carbide to establish metal carbonitride in the second region 712.

It will be appreciated that the second work function of the second region 712 is generally made higher than the first work function of the first region 710. For example, the second work function can be between about 4.8 eV and about 5.5 eV, for example. It will also be appreciated that the amount, concentration, energy level, etc. of oxygen and/or carbon 716 added can be varied to vary the resulting composition in the second region 712. This effectively provides a means for controllably adjusting the work function in the second region 712.

Figure 27:
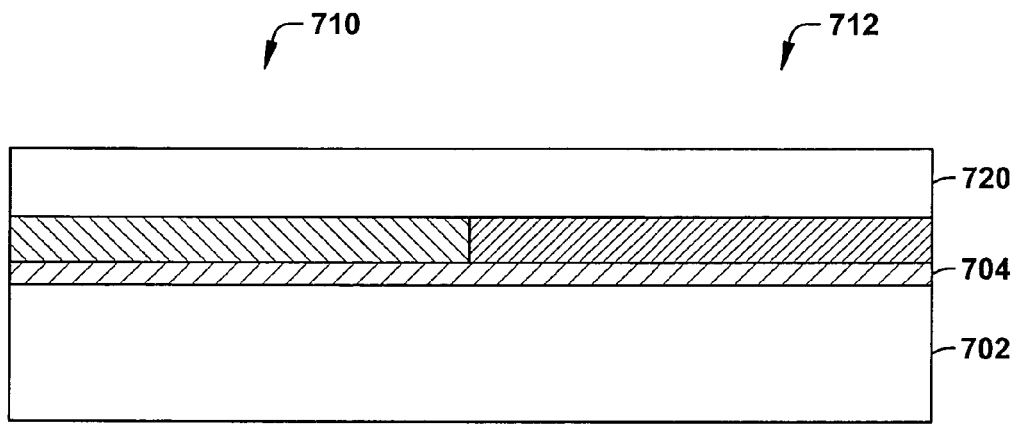

The patterned masking material 714 is stripped at 608 (FIG. 26), and a layer of polysilicon 720 is formed (e.g., deposited) over the first 710 and second 712 regions at 610 (FIG. 27). The polysilicon 720 can be formed to a thickness of about a few thousand nanometers or less, for example, and is generally used to form respective gate electrodes for different transistors.

Figure 28:
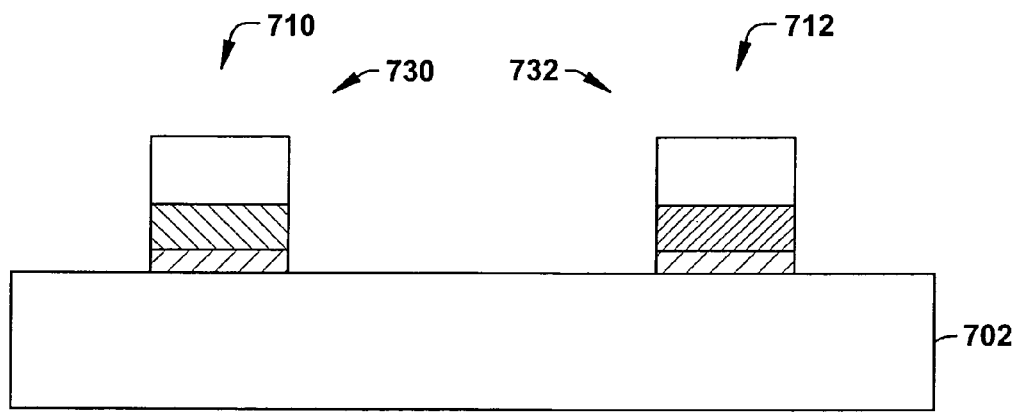

At 612, different transistor types are formed in the different regions 710, 712 (FIG. 28). For example, one or more NMOS type transistors can be fashioned in the first region 710 where the first work function is lower, while one or more PMOS type transistors can be fashioned in the second region 712 where the second work function is higher. Although not illustrated a layer of cladding or barrier material (e.g., TiN, TaN) can optionally be formed over the first 710 and second 712 regions before the polysilicon 720 is formed. Such a barrier layer material mitigates unwanted interaction between the polysilicon 720 and the first metal 706 in the first region 710 and the metal oxy nitride, metal carbide nitride or metal oxy carbide nitride 708 in the second region 712. The polysilicon 720, barrier, first metal 706, metal oxy nitride, metal carbide nitride or metal oxy carbide nitride 708 and dielectric 704 materials can be patterned to form first and second gate structures 730, 732 in the first 710 and second 712 regions, respectively, where the gate structures have a height of between about 50 to about 150 nanometers, for example.

Although not illustrated, it will be appreciated that remaining aspects of the transistors can then be formed by doping the substrate 702 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. It will be appreciated that forming metal gate transistors as described herein can be readily implemented in a CMOS fabrication process in an efficient and cost effective manner.

Accordingly, forming transistors according to one or more aspects of the present invention allows different types of metal gate transistors having different respective work functions to be concurrently formed in a single fabrication process. Forming the different types of transistors allows their respective advantages to be taken advantage of to satisfy different circuit application requirements. The metal gate transistors also allow feature sizes, such as dielectric thicknesses, for example, to be reduced to facilitate device scaling and increase packing densities.

It will be appreciated that while reference is made throughout this document to exemplary structures in discussing aspects of methodologies described herein (e.g., those structures presented in FIGS. 2-7 while discussing the methodology set forth in FIG. 1, structures presented in FIGS. 9-14 while discussing the methodology set forth in FIG. 8, structures presented in FIGS. 16-21 while discussing the methodology set forth in FIG. 15 and structures presented in FIGS. 23-28 while discussing the methodology set forth in FIG. 22), that those methodologies are not to be limited by the corresponding structures presented. Rather, the methodologies (and structures) are to be considered independent of one another and able to stand alone and be practiced without regard to any of the particular aspects depicted in the Figs.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming metal gate transistors, comprising:
   forming a layer of metal carbide material over a dielectric layer overlying a semiconductor substrate, the metal carbide having a first work function;
   selectively masking off the metal carbide so that the metal carbide is covered in a first region and exposed in a second region;
   adding at least one of oxygen and nitrogen to the exposed metal carbide in the second region to establish a second work function in the second region;
   forming a layer of polysilicon material over the first and second regions; and
   forming one or more first transistor types in the first region and one or more second transistor types in the second region.

2. The method of claim 1, wherein at least one of:
   the metal carbide comprises at least one of Sc, Y, Ti, Zr, Hf, V, Nb, Ta, Cr, Mo, W, La, Yb, Er,
   adding at least one of oxygen and nitrogen facilitates establishing at least one of metal oxy carbide, metal nitride carbide and metal oxy nitride carbide in the second region,
   the first work function is between about 3.5 eV and about 4.3 eV,
   the second work function is between about 4.8 eV and about 5.5 eV,
   the metal carbide is selectively masked off with a patterned layer of a capping material,
   the dielectric has a thickness of less than about 5 nanometers,
   the dielectric comprises at least one of silicon oxynitride (SiON) and a high k dielectric material,
   the at least one of oxygen and nitrogen are added by at least one of thermal, plasma, wet chemical and implantation processing, and
   the polysilicon is formed to a thickness of about a few hundred nanometers or less.

3. The method of claim 2, wherein the layer of capping material comprises silicon.

4. The method of claim 1, further comprising:
   forming barrier material over the first and second regions before the polysilicon is formed.

5. The method of claim 4, wherein the barrier material comprises at least one of TiN and TaN.

* * * * *